(12) United States Patent
Lin et al.

(10) Patent No.: US 8,173,498 B2
(45) Date of Patent: May 8, 2012

(54) METHOD FOR MANUFACTURING AN ARRAY SUBSTRATE

(75) Inventors: Hsiang-Lin Lin, Hsinchu (TW);
Ching-Huan Lin, Hsinchu (TW);
Chih-Hung Shih, Hsinchu (TW);
Wei-Ming Huang, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 270 days.

(21) Appl. No.: 12/623,497

(22) Filed: Nov. 23, 2009

(65) Prior Publication Data

US 2010/0301345 A1    Dec. 2, 2010

(30) Foreign Application Priority Data

May 26, 2009 (TW) .............................. 98117413 A

(51) Int. Cl.
*H01L 21/00* (2006.01)
*H01L 21/84* (2006.01)

(52) U.S. Cl. .............................. 438/155; 438/30; 257/71

(58) Field of Classification Search ..................... 438/30, 438/34, 155; 257/71
See application file for complete search history.

(56) References Cited

U.S. PATENT DOCUMENTS

2006/0003479 A1* 1/2006 Park et al. ........................ 438/30
2010/0267177 A1* 10/2010 Chen et al. ....................... 438/34

* cited by examiner

*Primary Examiner* — Phuc Dang
(74) *Attorney, Agent, or Firm* — Thomas|Kayden

(57) ABSTRACT

A method for manufacturing an array substrate is provided, wherein a data line is composed of first and second segments connected by a contact pad. First and second insulation layers are disposed between the first segment of the data line and a shielding electrode. In addition, the first insulation layer is disposed between the second segment of the data line and a gate line in their overlapping area. Accordingly, the coupling effect between the conductive layers can be reduced. For example, the RC delay problem due to parasitic capacitance between the shielding electrode and the data line is solved. As a result of the design of the two insulator layers between the first segment of the data line and the shielding electrode, the shorting between the conductive layers can also be simultaneously solved and the product yield can be increased.

9 Claims, 6 Drawing Sheets

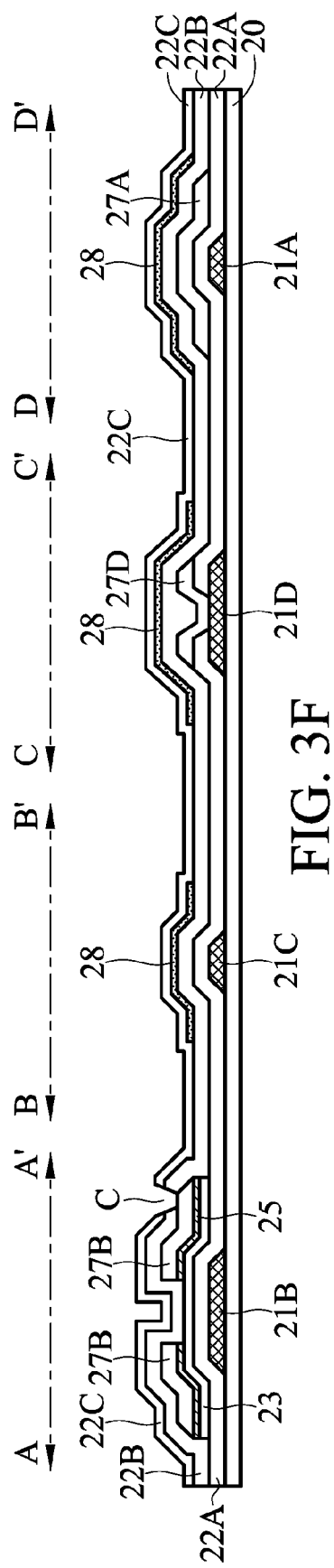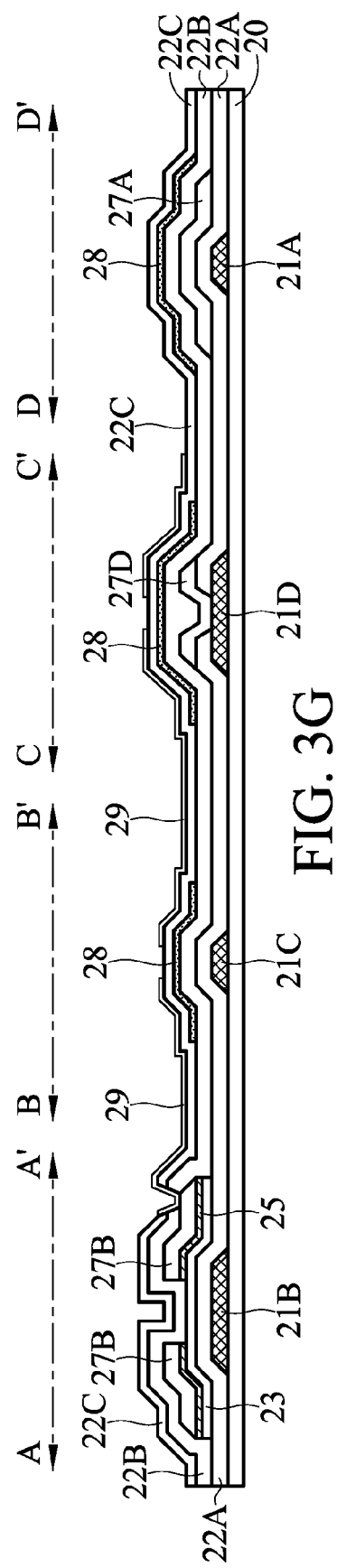

METHOD FOR MANUFACTURING AN ARRAY SUBSTRATE

CROSS REFERENCE TO RELATED APPLICATIONS

This Application claims priority of Taiwan Patent Application No. 098117413, filed on May 26, 2009, the entirety of which is incorporated by reference herein.

BACKGROUND OF THE DISCLOSURE

1. Field of the Disclosure

The present disclosure relates to liquid crystal displays, and in particular relates to array substrates and methods for manufacturing the same.

2. Description of the Related Art

In LCD manufacturing, the efficiency of the backlight and display brightness is directly influenced by the aspect ratio of pixel devices. A major factor of the aspect ratio is the distance between the data line and the transparent conductive electrode. If the distance therebetween is too short, the capacitance between the pixel and the data line (Cpd) is higher. In such a case, the full charged pixel electrode will change before a next signal transfer due to different voltages from the data line.

To reduce Cpd effect, a high aspect ratio structure is used, as shown in FIG. 1A, wherein a shielding electrode is disposed between the data line and the pixel electrode, wherein the shielding electrode is electrically connected to a common potential. Because the shielding electrode shields the electrical field of the data line, the pixel electrode is free from the influence of the data line signal, thereby reducing the crosslink associated with Cpd. The top view of the described structure is shown in FIG. 1A, and the cross sectional cross sectional views of line A-A' for transistor and line B-B' for data line are shown in FIG. 1B. A gate line 11 is firstly formed on a substrate 10, wherein the gate line 11 is a straight line without any broken segments in each pixel region, that is the whole gate line is made from the same layer in the same process and without bridging with different layers in different processes. The described structure is then covered by a first insulation layer 12A. Subsequently, a semiconductor layer 13 and an ohmic contact layer 15 are sequentially formed. A metal pattern is then formed to define source/drain electrodes 17A and a data line 17B, wherein the data line 17B is a straight line without any broken segments in each pixel region, that is the whole data line is made from the same layer in the same process and without bridging with different layers in different processes. A second insulation layer 12B is then formed to cover the described structure, and a shielding electrode 18 is formed on the data line 17B to reduce Cpd effect. A third insulation layer 12C is then formed to cover the described structure, and a part of the second and the third insulation layers 12B and 12C are removed to form a via hole A to expose a part of the drain electrode 17A. At last, a pixel electrode 19 is formed on the third insulation layer 12C of the pixel region, and the pixel electrode 19 electrically connects to a part of the drain electrode 17A of the transistor controlling the pixel region through the via hole A.

While the described structure mitigates Cpd effect, deficiencies still exist. Specifically, the described structure increases the overlapping area between the data line 17B and the shielding electrode 18 (so-called common electrode for transmitting a common voltage/signal). Therefore, parasitic RC delay effect is deteriorated due to higher electrical coupling between the data line 17B and the shielding electrode 18.

Accordingly, a novel structure mitigating Cpd effect and reducing parasitic RC between the common line and the data line without drastically increasing costs through requirements for new equipment or change in processes is called for.

BRIEF SUMMARY OF THE DISCLOSURE

The disclosure provides a method for manufacturing an array substrate, comprising: providing a substrate; forming a first patterned conductive layer on the substrate to define a gate line, a gate electrode, and a first segment of a data line having a terminal of a first data line contact pad; forming a first insulation layer on the first patterned conductive layer; forming a patterned semiconductor channel layer on the gate electrode; removing a part of the first insulation layer to expose a part of the first data line contact pad; forming a second patterned conductive layer to simultaneously define source/drain electrodes on the semiconductor channel layer and a second segment of the data line having a terminal of a second data line contact pad, wherein the second segment of the data line intersects the gate line, and the first insulation layer is disposed between the second segment of the data line and the gate line in an overlapping area of the second segment of the data line and the gate line; forming a second insulation layer covering the second patterned conductive layer; forming a third patterned conductive layer on the first and second segments of the data line, wherein the first and second insulation layers are disposed between the first segment of the data line and the third patterned conductive layer; forming a third insulation layer covering the third patterned conductive layer, the second segment of the data line, the source/drain electrodes, and the second insulation layer; removing a part of the second and third insulation layers on the drain electrode to form a via hole for exposing a part of the drain electrode; and forming a pixel electrode covering the third insulation layer, wherein the pixel electrode electrically connects to the exposed a part of the drain electrode through the via hole.

The disclosure also provides an array substrate, comprising: a substrate comprising a pixel region, wherein the pixel region is defined by a gate line, a first segment of a data line, and a second segment of the data line; wherein the first segment of the data line terminal electrically connects to the second segment of the data line, and the second segment of the data line intersects the gate line; a thin film transistor comprising a gate electrode connecting to the gate line, a semiconductor channel layer, and source/drain electrodes; a first insulation layer disposed on the first segment of the data line and the gate electrode, wherein the first insulation layer is disposed between the second segment of the data line and the gate line in an overlapping area of the second segment of the data line and the gate line; a second insulation layer disposed on the second segment of the data line, the first insulation layer, the source/drain electrodes, and a part of the semiconductor channel layer, wherein the second insulation layer exposes a part of the drain electrode; a shielding electrode disposed on the first segment of the data line and/or the second segment of the data line, wherein the first and second insulation layers are disposed between a part of the shielding electrode and the first segment of the data line; a third insulation layer covering the shielding electrode and the second insulation layer, wherein the third insulation layer exposes a part of the drain electrode; and a pixel electrode covering a part of the third insulation layer in the pixel region and electrically connected to the drain electrode.

A detailed description is given in the following embodiments with reference to the accompanying drawings.

BRIEF DESCRIPTION OF THE DRAWINGS

The present disclosure is more fully understood by reading the subsequent detailed description and examples with references made to the accompanying drawings, wherein:

FIGS. 3A-3G are cross-sectional views in serial processes to form an array substrate in one embodiment of the disclosure.

DETAILED DESCRIPTION OF THE DISCLOSURE

The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 1A:
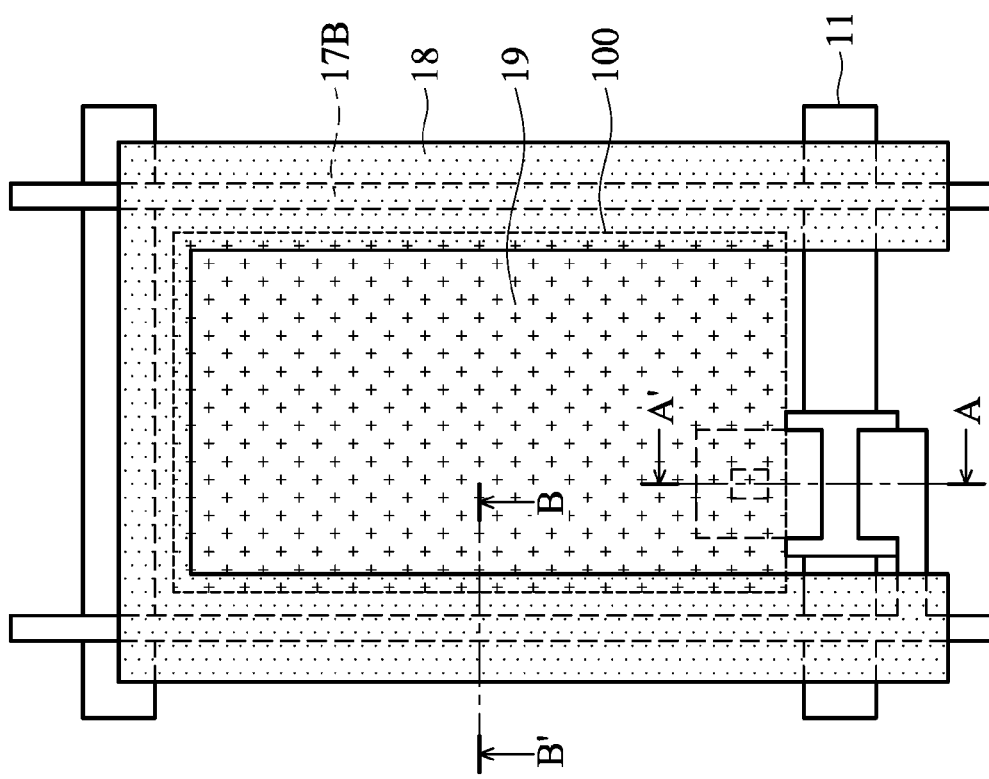
FIG. 1A is a top view of a conventional array substrate.
Figure 1B:
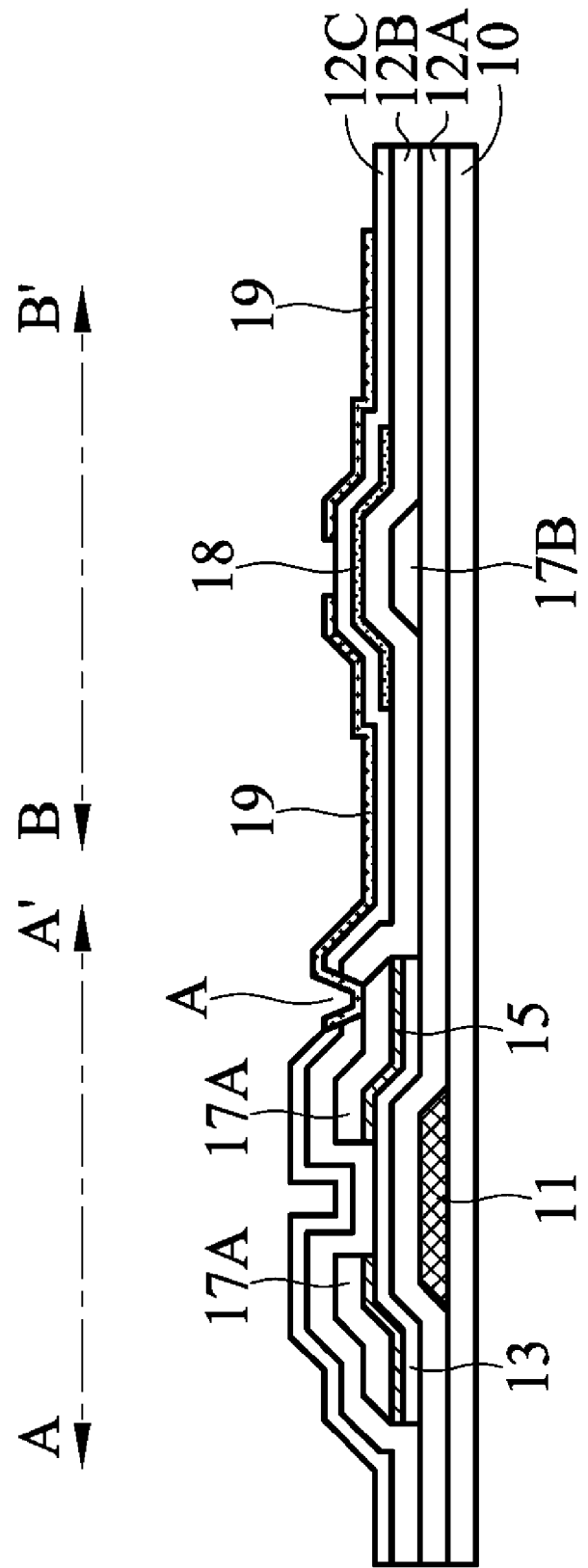
FIG. 1B is a cross-sectional view of a conventional array substrate.
Figure 2:
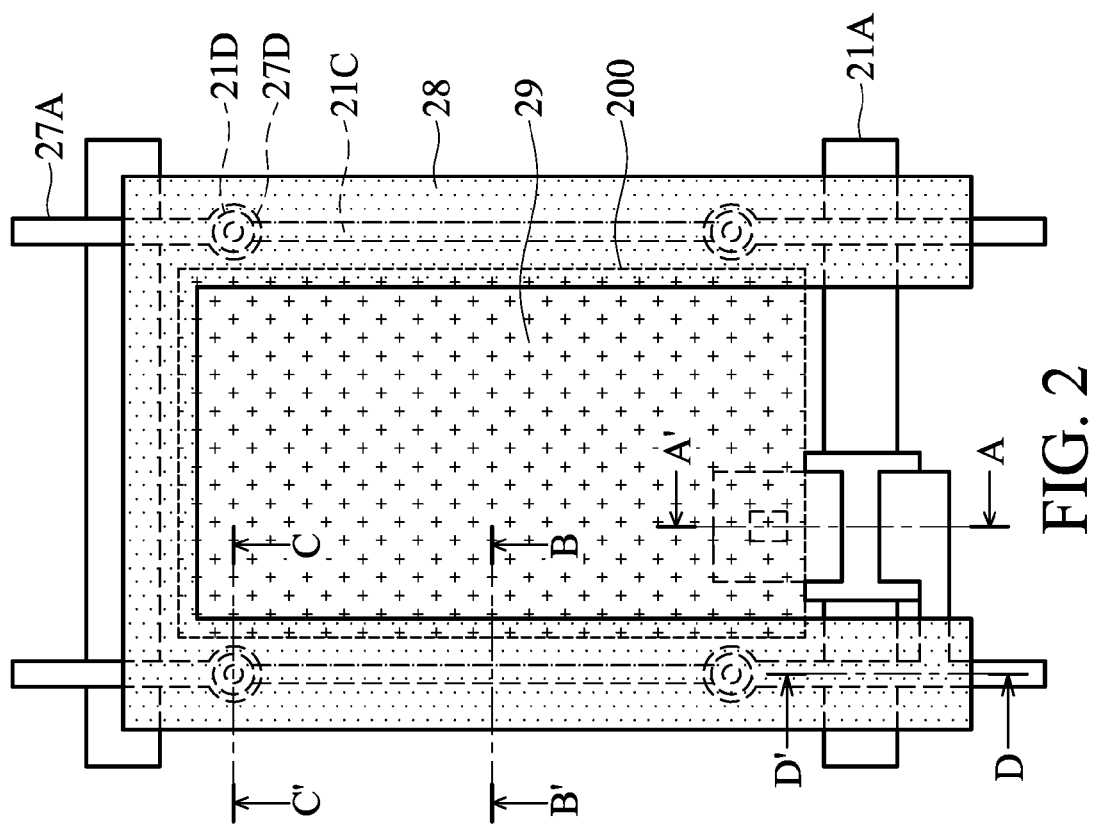
FIG. 2 is a top view of an array substrate in one embodiment of the disclosure.

The disclosure provides an array substrate structure for solving the problems of the conventional arts. The top view of the array substrate in the disclosure is shown in FIG. 2, and the cross-sectional views of cross-section lines A-A', B-B', C-C' and D-D' in FIG. 2 are all presented in FIG. 3G.

Figure 3A:
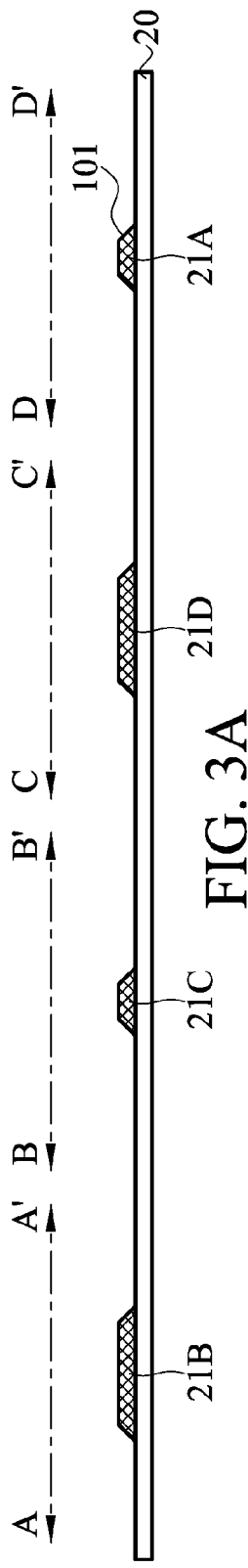

To complete the described structure, a substrate 20 is firstly provided. As shown in FIG. 3A, a first patterned conductive layer 101 is then formed on the substrate 20, wherein the patterned conductive layer 101 defines a gate line 21A, a gate electrode 21B of a transistor (not marked) electrically connected to the gate line 21A, and a first segment of a data line 21C having a terminal of a first data line contact pad 21D. The first segment of a data line 21C and the first data line contact pad 21D are simultaneously defined, and the contact pad 21D is positioned at any terminal of the data line according to design requirements. The method for forming the first conductive layer includes firstly forming a first conductive layer (not shown) on the substrate 20 and then patterning the first conductive layer (not shown). The substrate 20 can be transparent material such as glass, quartz, or other transparent material, opaque material such as ceramic, wafer, or other opaque material, or flexible material such as plastic, rubber, polyester, polycarbonate, or other flexible materials. The first patterned conductive layer 101 is made of metal material, such as Ti, Ta, Ag, Au, Pt, Cu, Al, Mo, Nd, W, Cr, Rh, Re, Ru, or Co, other suitable metals, alloys thereof, or metal oxide such as indium tin oxide (ITO), indium zinc oxide (IZO), or multi-layered structures thereof.

Figure 3B:
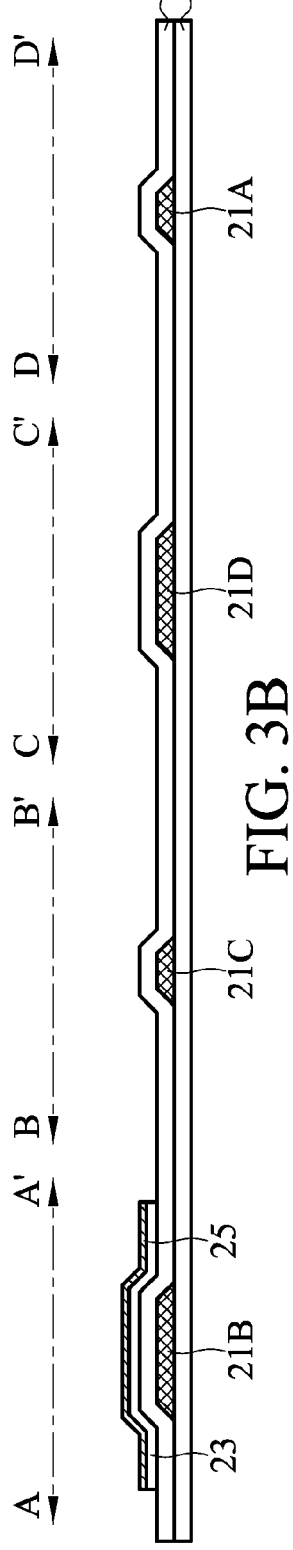

As shown in FIG. 3B, after a gate insulation layer 22A (or namely a first insulation layer) is formed to cover the first patterned conductive layer 101, a semiconductor channel layer 23 is then formed on the gate insulation layer 22A on the gate electrode 21B. In one embodiment, an ohmic contact layer 25 is optionally formed on the semiconductor channel layer 23. The gate insulation layer 22A includes organic material such as photoresist, organic silicon compound, or other organic materials, inorganic material such as silicon nitride, silicon oxide, silicon oxynitride, silicon oxycarbide, silicon carbide, or other inorganic materials, or combination thereof. The semiconductor channel layer 23 can be conventional semiconductor material such as amorphous silicon, polycrystalline silicon, microcrystalline silicon, single crystalline silicon, or combinations thereof. The semiconductor channel layer 23 can be formed by chemical vapor deposition (CVD), plasma enhanced CVD (PECVD), rapid thermal CVD (RTCVD), ultra high vacuum CVD (UHV/CVD), or molecular beam epitaxy (MBE) process. The ohmic contact layer is generally doped-silicon such as n-type or p-type if necessary.

The method for forming the semiconductor channel layer 23 includes the steps as described below. First, a semiconductor material layer (not shown) such as amorphous silicon is formed on the gate insulation layer 22A, and a doping process is optionally performed to form an ohmic contact material layer (not shown) on the top surface of the semiconductor material layer (not shown). The semiconductor material layer (not shown) is then patterned to form the semiconductor channel layer 23 and the ohmic contact layer 25 thereon. Note that the following description includes the ohmic contact layer 25 but is not limited thereto.

Figure 3C:
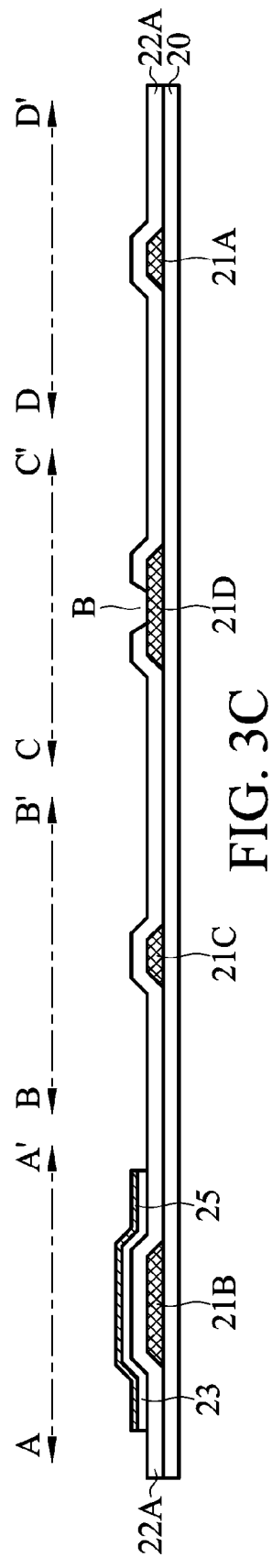

As shown in FIG. 3C, a part of the gate insulation layer 22A is removed to form a first via hole B to expose a part of the first data line contact pad 21D. The removal of the gate insulation layer 22A by a conventional lithography process combined with a dry or wet etching process.

Figure 3D:
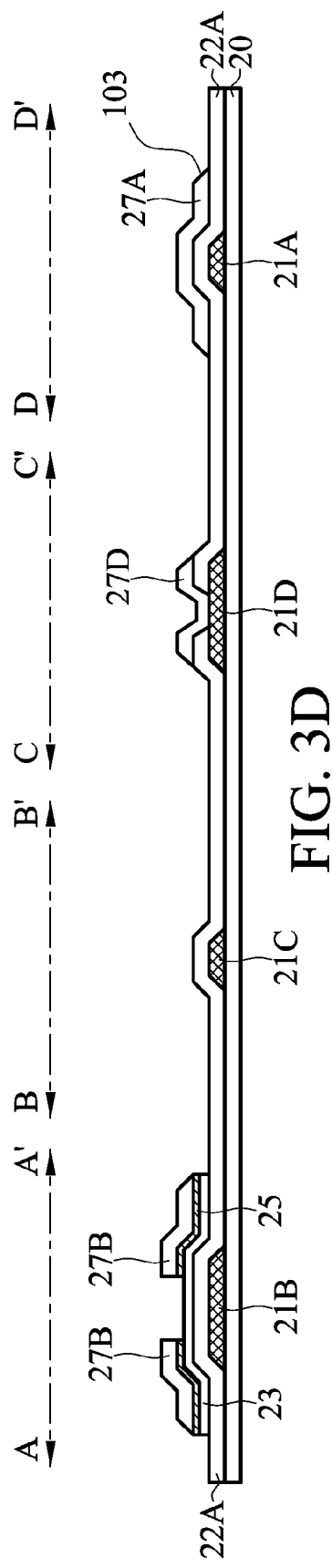

Referring to FIGS. 3D and 2, a second patterned conductive layer 103 is formed on the gate insulation layer 22A, the semiconductor channel layer 23, and the ohmic contact layer 25. The method for forming the second patterned conductive layer 103 includes several steps as described below. A second conductive layer (not shown) is formed on the gate insulation layer 22A and the ohmic contact layer 25, and then patterned to form the second patterned conductive layer 103. Note that the step of patterning the second conductive layer (not shown) simultaneously removes a part of the ohmic contact layer 25 on the gate electrode 21B. In detail, the second conductive layer (not shown) is patterned to form a second segment of the data line 27A having a terminal of second data line contact pad 27D and source/drain electrodes 27B. The second segment of a data line 27A and the second data line contact pad 27D are simultaneously defined, and the contact pad 27D can be positioned at any terminal of the data line according to design requirements. A part of the ohmic contact layer 25 not masked by the source/drain electrodes 27B is removed until a part of the semiconductor channel layer 23 on the gate electrode 21B is exposed.

As shown in FIGS. 3D and 2, the second data line contact pad 27D electrically connects to the first data contact pad 21D through the first via hole B. The second segment of the data line 27A intersects the gate line 21A to connect another first data line contact pad 21D of another pixel (not shown). As shown in cross sectional view of the cross section line D-D' in FIG. 3D, the gate insulation layer 22A is disposed between the second segment of the data line 27A and the gate line 21A in their overlapping region. Note that the first segment of the data line 21C and the second segment of the data line 27A have a length ratio, maybe the length ratio of about 1:1 to about 15:1, and preferably the length of the first segment of the data line 21C is greater than the length of the second segment of the data line 27A, wherein the first segment of the data line 21C and the second segment of the data line 27A have a length ratio, maybe the length ratio of about 13:1 to about 15:1. While the predetermined common electrode (or shielding electrode) overlaps more of the first segment of the data line 21C than the second segment of the data line 27A, parasitic RC between the data line and the common electrode is efficiently reduced. The second patterned conductive layer 103 can be metal such as Ti, Ta, Ag, Au, Pt, Cu, Al, Mo, Nd, W, Cr, Rh, Re, Ru, Co, other metals, alloys thereof, or multi-layered structures thereof.

Figure 3E:
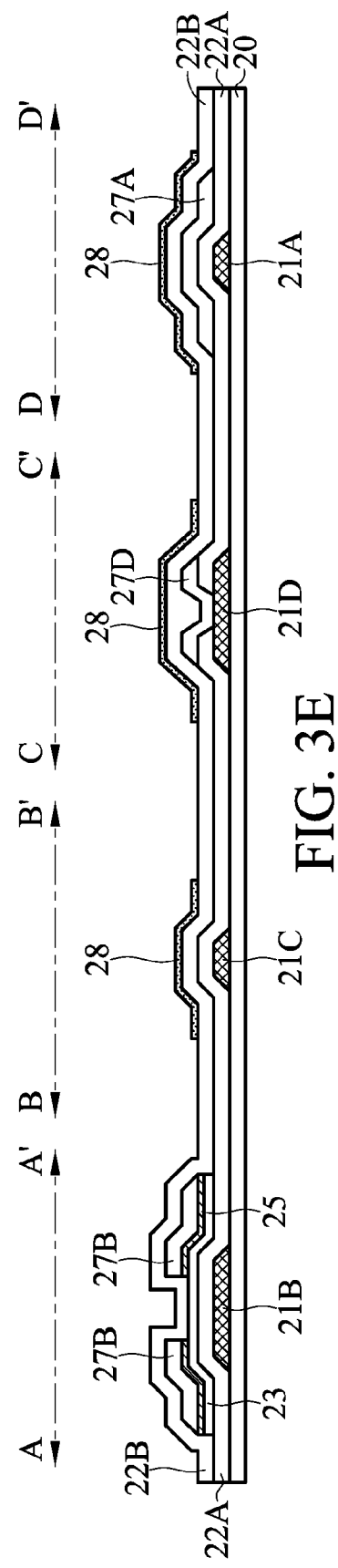

As shown in FIG. 3E, a second insulation layer 22B is formed on the gate insulation layer 22A to cover the second patterned conductive layer 103. The method for forming the second insulation layer 22B includes forming a second dielectric layer (not shown) to cover the gate insulation layer 22A and the second patterned conductive layer 103 on the substrate 100. Subsequently, a shielding electrode 28 is formed on the first segment of the data line 21C, the first data line contact pad 21D, and the second segment of the data line 27A. The method for forming the shielding electrode 28 includes forming a third conductive layer (not shown) to cover the insulation layer 22B, and the third conductive layer (not shown) is then patterned.

The material and manufacturing of the second insulation layer 22B is similar to the gate insulation layer 22A, and the two insulation layers can be same or different materials. In one embodiment, the gate insulation layer 22A and the second insulation layer 22B have a total thickness of about 6000 μm to about 12000 μm, or about 4000 μm to about 7000 μm. In another embodiment, the second insulation layer 22B has a thickness of about 1500 μm to about 6000 μm, and preferably about 3000 μm to about 4000 μm. The material of the shielding electrode 28 is similar to the described patterned conductive layer. The shielding electrode 28 electrically connects to a common electrode, and therefore has common electrode effect, wherein the common electrode transmits a common voltage or a common signal. The common potential of the shielding electrode 28 may shield the electrical field of the data line, thereby reducing Cpd effect and crosslink problems. Compared to related arts, wherein the convention structure only has a single insulation layer 12B disposed between the data line 17B and the shielding electrode 18, in the disclosure, the gate insulation layer 22A and the second insulation layer 22B are disposed between a major of a part of the data line (e.g. the first segment of the data line 21C) and the shielding electrode 28. Accordingly, the coupling effect between the data line and the shielding electrode is reduced, such that the parasitic RC delay problem of the data line is also reduced. Moreover, the two insulation layers 22A and 22B disposed between the data line and the shielding electrode decreases shorting therebetween. Thus, product yield is efficiently increased.

As shown in FIG. 3F, a protection layer 22C (or namely third insulation layer) is then formed on the shielding electrode 28 and the second insulation layer 22B, and a part of the second insulation layer 22B and a part of the protection layer 22C are then removed to form a second via hole C to expose a part of the transistor drain electrode 27B. The material and the manufacturing of the protection layer 22C is similar to the gate insulation layer 22A and the second insulation layer 22B, and the protection layer/second insulation layers are same or different materials.

As shown in FIG. 3G, a pixel electrode 29 is formed on the protection layer 22C, wherein the pixel electrode 29 electrically connects the drain electrode 27B through the second via hole C. The method for forming the pixel electrode 29, forms a transparent conductive layer (not shown) such as ITO, IZO, and the likes on the protection layer 22C, and then patterns the transparent conductive layer (not shown) to form the pixel electrode 29.

As described above, the transparent conductive layer 29 is composed of a transparent conductive material such as ITO, IZO, aluminum zinc oxide (AZO), cadmium tin oxide (CTO), or combinations thereof. As shown in the cross-sectional view of the cross section line B-B' in FIG. 3G, the overlapping region of the pixel electrode 29, the protection layer 22C, and the shielding electrode 28 constitutes a storage capacitor. Because two insulation layers such as the gate insulation layer 22A and the second insulation layer 22B are disposed between a major part of the data line (e.g. the first segment of the data line 21C) and the shielding electrode 28, coupling effect and the crosslink problem between the conductive layers are reduced. For example, the parasitic RC delay of the first segment of the data line 21C and the shielding electrode 28 is reduced, and the crosslink between the first segment of the data line 21C and the shielding electrode 28 is reduced. Furthermore, the two insulation layers such as the gate insulation layer 22A and the second insulation layer 22B disposed between the data line and the shielding electrode 28 decreases shorting therebetween. Thus, product yield is efficiently increased.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for manufacturing an array substrate, comprising:
    providing a substrate;
    forming a first patterned conductive layer on the substrate to define a gate line, a gate electrode, and a first segment of a data line having a terminal of a first data line contact pad;
    forming a first insulation layer on the first patterned conductive layer;
    forming a patterned semiconductor channel layer on the gate electrode;
    removing a part of the first insulation layer to expose a part of the first data line contact pad;
    forming a second patterned conductive layer to simultaneously define source/drain electrodes on the patterned semiconductor channel layer and a second segment of the data line having a terminal of a second data line contact pad, wherein the second segment of the data line intersects the gate line, and the first insulation layer is disposed between the second segment of the data line and the gate line in an overlapping area of the second segment of the data line and the gate line;
    forming a second insulation layer covering the second patterned conductive layer;
    forming a third patterned conductive layer on the first and second segments of the data line, wherein the first and second insulation layers are disposed between the first segment of the data line and the third patterned conductive layer;
    forming a third insulation layer covering the third patterned conductive layer, the second segment of the data line, the source/drain electrodes, and the second insulation layer;
    removing a part of the second and third insulation layers on the drain electrode to form a via hole for exposing a part of the drain electrode; and
    forming a pixel electrode covering the third insulation layer, wherein the pixel electrode electrically connects to the exposed part of the drain electrode through the via hole.

wherein a part of the pixel electrode overlaps the third patterned conductive layer.

2. The method as claimed in claim 1, wherein the first and second insulation layers comprise silicon nitride, silicon oxide, silicon oxynitride, silicon carbide, or multi-layered structures thereof.

3. The method as claimed in claim 1, wherein the first and second insulation layers have same or different compositions.

4. The method as claimed in claim 1, wherein the second insulation layer has a thickness of about 1500 μm to about 6000 μm.

5. The method as claimed in claim 1, wherein the second insulation layer has a thickness of about 3000 μm to about 4000 μm.

6. The method as claimed in claim 1, wherein the first and second insulation layers have a total thickness of about 6000 μm to about 12000 μm.

7. The method as claimed in claim 1, wherein the first and second insulation layers have a total thickness of about 4000 μm to about 7000 μm.

8. The method as claimed in claim 1, further comprising a step for forming an ohmic contact layer between the semiconductor channel layer and the source/drain electrodes.

9. The method as claimed in claim 1, wherein the third patterned conductive layer, the third insulation layer on the third patterned conductive layer, and the part of the pixel electrode overlapping the third patterned conductive layer constitute a storage capacitor.

* * * * *